(12) United States Patent
Alalusi et al.

(10) Patent No.: US 11,605,930 B2
(45) Date of Patent: Mar. 14, 2023

(54) DISTRIBUTED FEEDBACK LASER

(71) Applicant: ROCKLEY PHOTONICS LIMITED, London (GB)

(72) Inventors: Mazin Alalusi, Sunnyvale, CA (US); Kevin Masuda, Alhambra, CA (US); Pradeep Srinivasan, Fremont, CA (US)

(73) Assignee: Rockley Photonics Limited, Altrincham (GB)

( * ) Notice: Subject to any disclaimer, the term of this patent is extended or adjusted under 35 U.S.C. 154(b) by 288 days.

(21) Appl. No.: 16/826,122

(22) Filed: Mar. 20, 2020

(65) Prior Publication Data

US 2020/0303891 A1    Sep. 24, 2020

Related U.S. Application Data

(60) Provisional application No. 62/822,635, filed on Mar. 22, 2019.

(51) Int. Cl.
*G02B 6/12*    (2006.01)
*H01S 3/067*    (2006.01)

(52) U.S. Cl.
CPC ........ *H01S 3/0675* (2013.01); *G02B 6/12019* (2013.01); *G02B 2006/12061* (2013.01); *G02B 2006/12078* (2013.01); *G02B 2006/12121* (2013.01)

(58) Field of Classification Search
CPC .................................................... H01S 3/0675
See application file for complete search history.

(56) References Cited

U.S. PATENT DOCUMENTS

| 5,802,096 A * | 9/1998 | Okuda ...................... H01S 5/12 |
| | | 372/45.01 |
| 2002/0163948 A1* | 11/2002 | Yoshida .................. H01S 5/125 |
| | | 372/45.01 |
| 2009/0168821 A1 | 7/2009 | Fang et al. |
| 2010/0265980 A1 | 10/2010 | Matsuda |

(Continued)

FOREIGN PATENT DOCUMENTS

| EP | 0 169 567 A2 | 1/1986 |
| EP | 1 202 410 A2 | 5/2002 |

(Continued)

OTHER PUBLICATIONS

English translation of JP2006-108370A (Year: 2006).*

(Continued)

*Primary Examiner* — Charlie Y Peng
(74) *Attorney, Agent, or Firm* — Lewis Roca Rothgerber Christie LLP

(57) ABSTRACT

A Distributed Feedback Laser (DFB) mounted on a Silicon Photonic Integrated Circuit (Si PIC), the DFB having a longitudinal length which extends from a first end of the DFB laser to a second end of the DFB laser, the DFB laser comprising: an epi stack, the epi stack comprising: one or more active material layers; a layer comprising a partial grating, the partial grating extending from the second end of the DFB laser, only partially along the longitudinal length of the DFB laser such that it does not extend to the first end of the DFB laser; a highly reflective medium located at the first end of the DFB laser; and a back facet located at the second end of the DFB laser.

19 Claims, 6 Drawing Sheets

(56) References Cited

U.S. PATENT DOCUMENTS

| | | |
|---|---|---|
| 2010/0327257 A1 | 12/2010 | Yamamoto et al. |
| 2015/0117478 A1* | 4/2015 | Banno .................. H01S 5/0617 372/38.1 |
| 2017/0179680 A1* | 6/2017 | Mahgerefteh ........ G02B 6/1228 |

FOREIGN PATENT DOCUMENTS

| | | | |
|---|---|---|---|
| EP | 1 298 767 A2 | | 4/2003 |
| JP | 11163464 A | * | 6/1999 |
| JP | 2006108370 A | * | 4/2006 |
| JP | 2011049346 A | * | 3/2011 |
| WO | WO 02/075880 A1 | | 9/2002 |
| WO | WO 2018/027058 A1 | | 2/2018 |
| WO | WO 2018/184697 A1 | | 10/2018 |

OTHER PUBLICATIONS

English translation of JP 2011-49346 A (Year: 2011).*
U.K. Intellectual Property Office Examination Report, dated Jan. 5, 2022, for Patent Application No. GB2004109.1, 3 pages.
U.K. Intellectual Property Office Examination Report, dated Jul. 19, 2021, for Patent Application No. GB2004109.1, 3 pages.
Huang, Y. et al., "External optical feedback resistant characteristics in partially corrugated-waveguide laser diodes", Electronics Letters, May 23, 1996, pp. 1008-1009, vol. 32, No. 11, IEE.
Huang, Y. et al., "High-Yield External Optical Feedback Resistant Partially Corrugated Waveguide Laser Diodes", IEEE Journal of Selected Topics in Quantum Electronics, May/Jun. 1999, pp. 435-441, vol. 5, No. 3, IEEE.
Pukhrambam, P.D. et al., "Electroabsorption Modulated Lasers With High Immunity to Residual Facet Reflection by Using Lasers With Partially Corrugated Gratings", IEEE Photonics Journal, Apr. 2017, 17 pages, vol. 9, No. 2, IEEE.
Schares, L. et al., "An 8-Wavelength Laser Array with High Back Reflection Tolerance for High-Speed Silicon Photonic Transmitters", 2014, 3 pages, OSA.
Walraven, P.J., "Design of Grating Structures to Reduce Longitudinal Spatial Hole Burning in Distributed Feedback Lasers", Eindhoven University of Technology, 1995, 62 pages.
Website: "Metalorganic vapour-phase epitaxy", Wikipedia, printed Jun. 24, 2020, 9 pages, https://en.m.wikipedia.org/wiki/Metalorganic_vapour-phase_epitaxy.
U.K. Intellectual Property Office Search and Examination Report, dated Apr. 8, 2020, for Patent Application No. GB2004109.1, 7 pages.
Gallet, A. et al., "Design, Fabrication and Characterization of Hybrid III-V/SOI Phase-shift Free DFB Laser with Tapered Silicon waveguide", 2018 European Conference on Optical Communication, Sep. 23, 2018, 3 pages, IEEE.
International Search Report and Written Opinion of the International Searching Authority, dated Jun. 23, 2020, Corresponding to PCT/EP2020/057875, 15 pages.
European Patent Office Communication pursuant to Article 94(3) EPC, for patent application 20 714 512.9, dated Nov. 25, 2022, 10 pages.

* cited by examiner

Fig. 1 – PRIOR ART

Broadband grating mirror

Partial grating+broadband grating mirror AR/AR DFB

DISTRIBUTED FEEDBACK LASER

CROSS-REFERENCE TO RELATED APPLICATION(S)

The present application claims priority to and the benefit of U.S. Provisional Patent Application No. 62/822,635, filed Mar. 22, 2019, entitled "DISTRIBUTED FEEDBACK LASER", which is incorporated herein by reference.

FIELD

One or more aspects of embodiments according to the present invention relate to a Distributed Feedback (DFB) Laser, and more particularly to a DFB Laser mounted on a Silicon Photonic Integrated Circuit (Si PIC).

BACKGROUND

A DFB laser is a laser comprising a resonator cavity which includes a periodically fabricated element such as a diffraction grating which provides optical feedback within the cavity, thereby acting to select the lasing wavelength of the laser. In typical prior art examples of a DFB laser, such as that shown in FIG. 1, the resonator cavity is made up of a periodic grating with a back facet at one end and a front facet at the other end. A quarter wavelength shift (QWS) or an isolator is applied at some point between the two facets in order to ensure that lasing only occurs at a certain mode. Both front and back facets are typically coated with an anti-reflection coating since significant power losses occur at the facets. In general, often due to the presence of an isolator element, DFB lasers can require a significant amount of optical components for stability. There exists a desire to simplify DFB lasers whilst improving their stability and reliability.

SUMMARY

Accordingly, some embodiments of the present invention aim to solve the above problems by providing, according to a first aspect, a Distributed Feedback Laser (DFB) for mounting on a Silicon Photonic Integrated Circuit (Si PIC), the DFB having a longitudinal length which extends from a first end of the DFB laser to a second end of the DFB laser, the DFB laser comprising:
  an epi stack, the epi stack comprising:
    one or more active material layers;
    a layer comprising a partial grating, the partial grating extending from the second end of the DFB laser, only partially along the longitudinal length of the DFB laser such that it does not extend to the first end of the DFB laser;
  a highly reflective medium located at the first end of the DFB laser; and
  a back facet located at the second end of the DFB laser.

Some embodiments of the invention eliminate the need for an optical isolator and any extra optics associated with such an isolator. This results in a less expensive product due to the fact that fewer components are required. There is also a reduction in the packaging required and the invention therefore results in a higher packaging yield.

The Distributed Feedback Laser may have any one or, to the extent that they are compatible, any combination of the following optional features.

In one or more embodiments of the present invention, the DFB does not include any form of cooling device. This is because, advantageously, the combination of features of the claimed laser results in a laser that can function in a stable and reliable manner without the need for temperature cooling. That is to say, there is no need for a TEC (thermoelectric cooler, or Peltier device). The resulting uncooled laser is less expensive to run since the power consumed by a TEC during use can be eliminated.

In one or more embodiments, the highly reflective medium is a high reflectivity (HR) back facet.

In one or more embodiments, the highly reflective medium is a broadband grating mirror.

Optionally, the broadband grating mirror may be a chirped grating.

The epi stack controls the gain properties and bandwidth of the DFB laser. In some embodiments, the gain bandwidth has a FWHM of at least 80 nm. In some embodiments, the gain bandwidth has a FWHM of at least 40 nm.

In one or more embodiments, the lasing wavelength, which is defined by the partial grating, has a shorter wavelength than the material gain peak of the epi stack.

In this way, an effect known as "blue detuning" can be utilized. This is where the lasing wavelength of a laser is located on the blue side of the material gain peak of the laser (i.e. on the shorter wavelength side). This blue detuning results in a higher back reflection tolerance.

In one or more embodiments, the epi stack is flip chip mounted onto the Si PIC.

In one or more embodiments, the Si PIC includes one or more silicon waveguides, which align with at least one of the active material layers of the epi stack.

In some embodiments, the active material layers of the epi stack are formed from an Al based InP epitaxy. In this way, the Al based InP epitaxy forms the gain medium of the laser. This choice of material system enables the laser to operate without cooling.

Optionally, the epi stack may include active layers formed of $Al_{(x)}GaIn_{(y)}As$.

In one or more embodiments, the epi stack includes a PIN junction.

In one or more embodiments, the active material layers of the epi stack are undoped and form the intrinsic portion of the PIN junction.

In one or more embodiments, the partial grating is located on one side of the active material layers, and wherein the epi stack comprises P-doped layers on the same side of the active material layers as the partial grating.

In one or more embodiments, the epi stack comprises N-doped layers on the opposite side of the material layers from the partial grating.

In some embodiments, the grating is located above the gain medium. In other embodiments, the grating is located underneath the gain medium. Either way, there is no lasing action at the location at which the grating is etched.

In some embodiments, the gain medium (i.e. the active region) and the grating are part of a single epi stack.

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
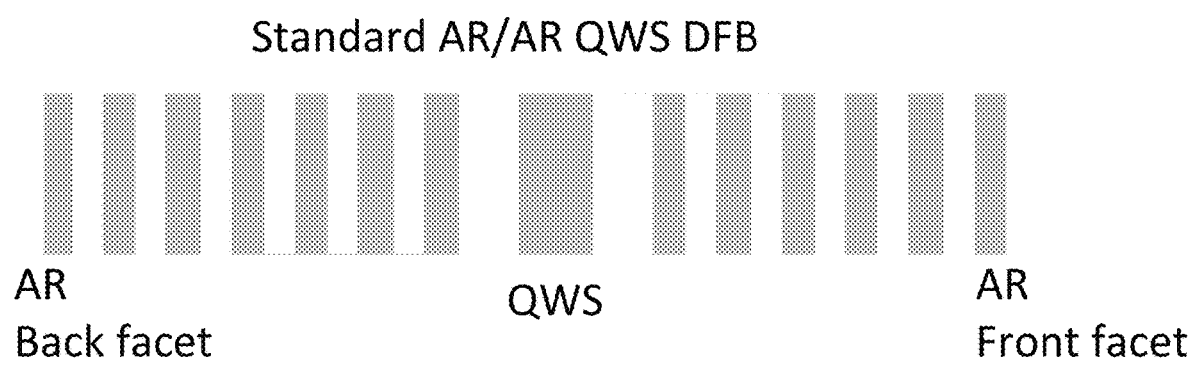
FIG. 1 is an example of a known DFB laser that does not form part of the prior art.

The detailed description set forth below in connection with the appended drawings is intended as a description of exemplary embodiments of a DFB laser provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

A first embodiment of a DFB laser according to the present invention is described below with reference to FIGS. 2 and 6. The DFB laser is formed from a resonator cavity (laser cavity) which has a longitudinal length extending from a first end of the DFB laser 10 to a second end of the DFB laser 10. A partial grating 21 extends along a portion of the DFB laser, starting at the first end 11 and extending along a part of the longitudinal length of the resonator cavity of the DFB laser. That is to say, the partial grating does not extend all the way up to the second end of the laser. Instead, there is a portion of the laser adjacent the first end 10 that does not include a grating. A highly reflective coating is located at the first end of the resonator cavity of the DFB laser 10. An anti-reflective (AR) coating is located at the end of the partial grating which forms the second end of the resonator cavity of the DFB laser. The AR coating may be formed from any coating known in the art, with the aim of reducing the amount of reflection that occurs at the facet, thereby increasing the amount of power that exits the laser cavity. A highly reflective (HR) coating is located at the first end 10 of the resonator cavity of the DFB laser 1, adjacent the "no grating" region of the resonator cavity.

Figure 6:
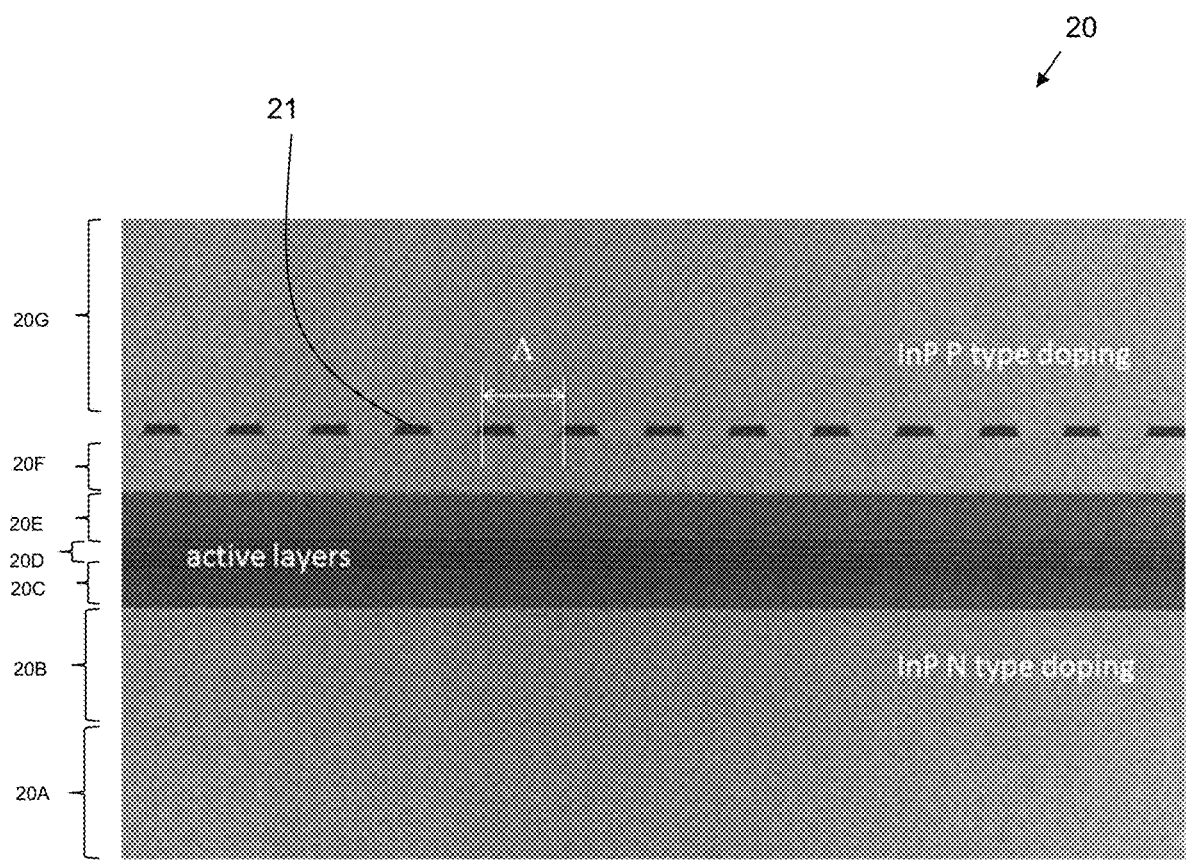
FIG. 6 is an example of an epi-stack of a DFB laser according to an embodiment of the present invention.

The fabrication structure of the DFB laser 1 can be better understood with reference to FIG. 6. Which depicts the epi stack 20 of the DFB laser. In particular, the epi stack comprises one or more active material layers 20D. The epi stack may be formed from layers which include an Al based InP epitaxy. Al based InP epitaxy provides an advantage in that it is less sensitive to temperature variation as compared to other materials, particularly at high temperature operation, which is particularly appealing for an uncooled system. The active layers may include a quantum well structure and may be made from a material such as $Al_{(x)}GaIn_{(y)}As$. Typically, the layers of the epi stack 20 form a PIN junction within which the active layers are located, typically at the intrinsic region of the junction. In the embodiment of FIG. 6, the grating 21 is located in the p doped region and may be fabricated of a material such as $GaIn_{(x)}As_{(y)}P$. It is envisaged that the grating 21 could be located above, or below the active layers within the epi stack. In this case "above" simply refers to a layer deposited in a latter step of the epi stack deposition process relative to the active material layers 20D, whereas "below" refers to a layer deposited in an earlier deposition step, before the deposition of the active layers 20D.

In the embodiment shown in FIG. 6, it should be noted that the figure shows only a zoomed in version of the portion of the resonator cavity which includes the partial grating 21.

The epi stack shown in FIG. 6 includes initial N doped epi layers 20A which may be formed from a material such as InP doped with an N dopant such as silicon. In the order of deposition, these are followed by: an intermediate N doped layer 20B also formed from a material such as InP doped with an N dopant such as silicon; and a further intermediate N doped layer 20C formed of a material such as $Al_{(x)}GaIn_{(y)}As$ doped with an N type dopant such as silicon. Next, comes the active material layers 20D, followed by an intermediate P doped layer 20E formed of a material such as $Al_{(x)}GaIn_{(y)}As$ doped with a P type dopant such as zinc. The immediate layers 20C and 20E which immediately flank the active material layers are purposefully fabricated using the same material as the active layer but are doped (whereas the active layer 20D itself is undoped). Next comes another P doped layer 20F formed from a material such as InP doped with a P-type dopant such a zinc. Then, the grating 21 is deposited, followed by another P doped layer 20G which may be made of a material such as InP doped with zinc. An aim of the multiple layers is to slowly adjust the materials between the outermost layers (of e.g. InP) and the active material layers (of e.g. $Al_{(x)}GaIn_{(y)}As$) such that lattice mismatch effects are minimized.

Figure 2:
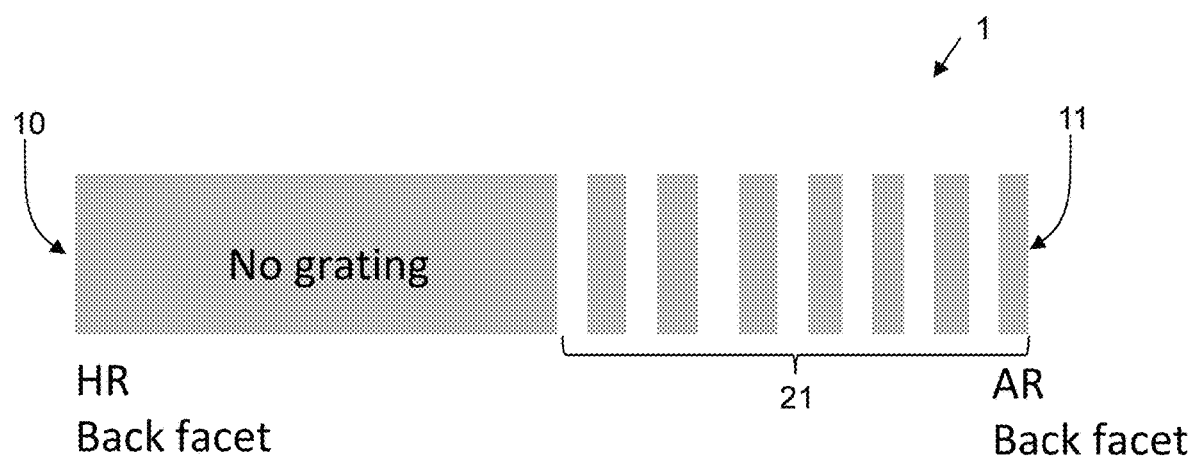
FIG. 2 is a schematic diagram of a DFB laser according to an embodiment of the present invention.
Figure 3:
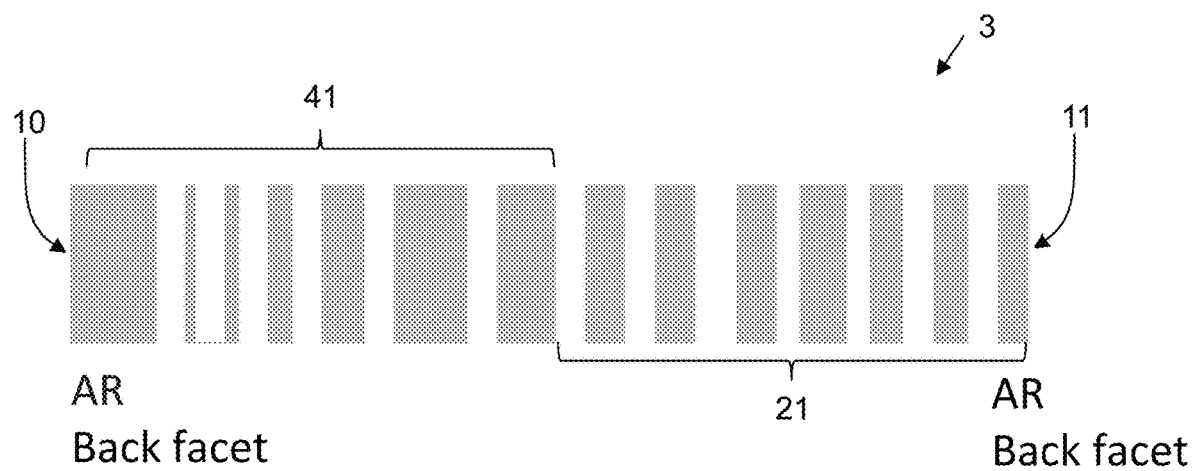
FIG. 3 is a schematic diagram of an alternative DFB laser according to a further embodiment of the present invention.

An alternative embodiment is shown in FIG. 3 where like reference numbers are used to denote features also found in the embodiment of FIG. 2. As with the embodiment in FIG. 6, the partial grating 21 may form part of an epi stack 20 such as that shown in FIG. 6.

The DFB laser 3 of FIG. 3 differs from that of FIG. 2, in that the HR facet at the first end 10 of the resonator cavity has been replaced by a broadband grating mirror 41. This results in an isolator-free DFB laser with a very accurate wavelength since the back facet at the second end 11 is AR coated and the broadband grating 41 at the first end 10 avoids any interaction with a HR facet. That is to say, the resonator cavity is immune to any phase errors that would have been introduced by fabrication cleaving that would typically be involved in forming a HR facet.

Figure 4:
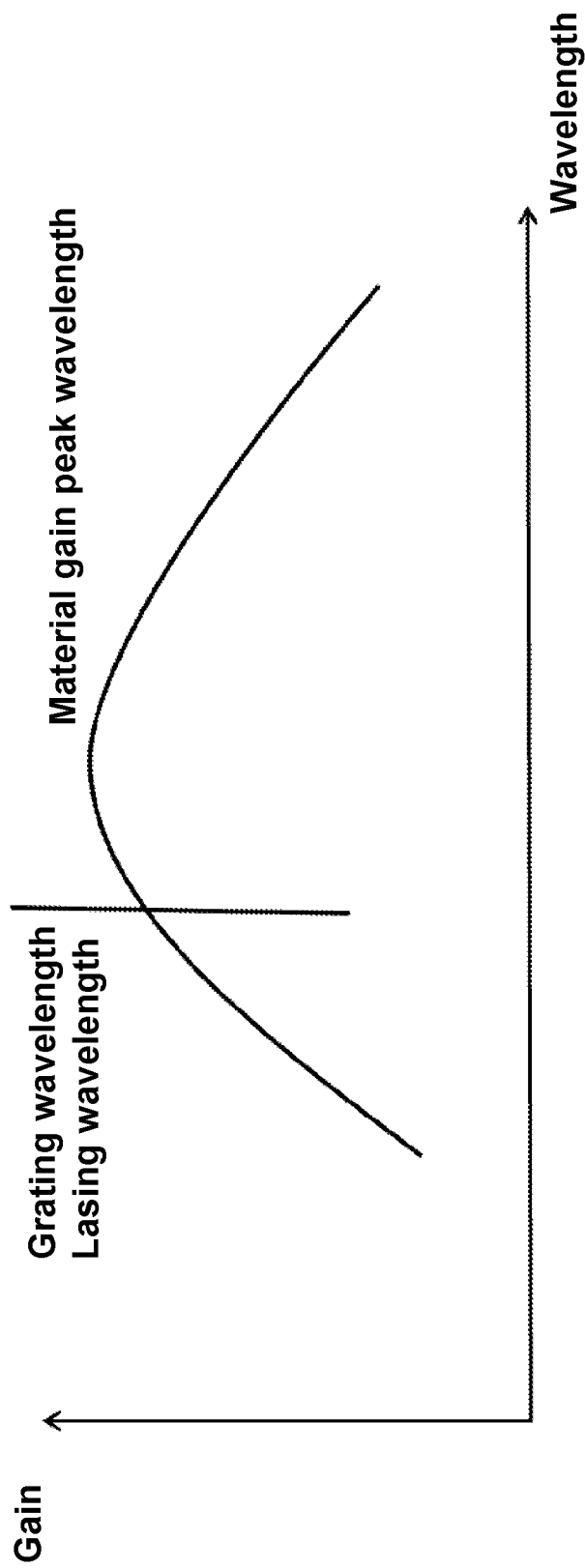
FIG. 4 is a graph depicting the concept of blue detuning.

FIG. 4 depicts the "blue detuning" principle which may be applied to any of the embodiments described herein. The principle behind this is to select a lasing wavelength (determined by the partial grating 21) which is located at the blue side (i.e. at shorter wavelengths) of the gain peak of the gain material of the laser, in this case determined by the material of the active material layers 20D. By designing the grating so that it is always on the short wavelength side of the gain peak it is possible to ensure a smaller linewidth enhancement factor, which makes the DFB laser more robust against unwanted backreflection effects. This results in a laser which is more reliable and stable, and less temperature dependent.

Figure 5:
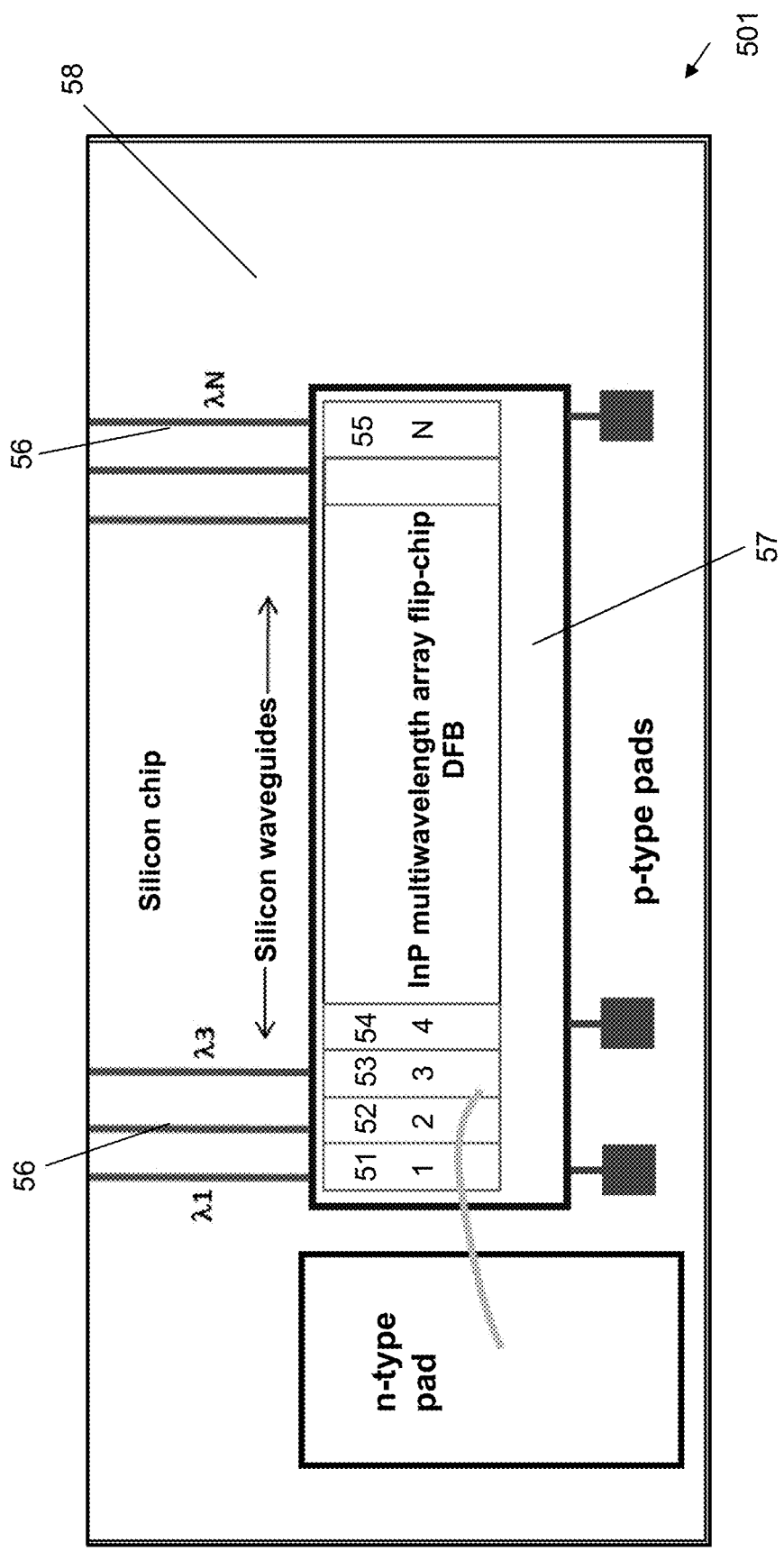
FIG. 5 is a schematic diagram of an array of DFB lasers according to some embodiments of the present invention.

An array of DFB lasers is shown in FIG. 5. Each of the DFB lasers 51, 52, 53, 54, 55 may take the form of the DFB lasers of FIG. 2 or FIG. 3. The DFB array is formed from a single chip 57, in this case an InP chip. It is flip-chip mounted onto a Silicon Photonic Integrated Circuit (Si PIC). Silicon waveguides 56 are positioned to be coupled to the flipped DFB lasers in order to act as respective exit waveguides for each of the respective DFB lasers. The partial grating of each laser is typically different from laser to laser within the array such that each DFB laser provides a different channel having a different wavelength. Passive alignment is used. Additionally or alternatively tapers may be used to taper from the waveguides to the DFB lasers. In this way, coupling efficiency can be maximized and the sensitivity to miss-alignment reduced.

Although exemplary embodiments of a Distributed Feedback Laser (DFB) have been specifically described and illustrated herein, many modifications and variations will be apparent to those skilled in the art. Accordingly, it is to be understood that a Distributed Feedback Laser (DFB) constructed according to principles of this invention may be embodied other than as specifically described herein. The invention is also defined in the following claims, and equivalents thereof.

What is claimed is:

1. A Distributed Feedback (DFB) Laser for mounting on a Silicon Photonic Integrated Circuit (Si PIC), the DFB laser having a longitudinal length which extends from a first end of the DFB laser to a second end of the DFB laser, the DFB laser comprising:
   an epi stack, the epi stack comprising:
      one or more active material layers; and
      a layer comprising a partial grating, the partial grating extending from the second end of the DFB laser, only partially along the longitudinal length of the DFB laser such that it does not extend to the first end of the DFB laser;
   a highly reflective medium located at the first end of the DFB laser; and
   a back facet located at the second end of the DFB laser, and
   the DFB laser being enabled to operate without a cooling device,
   wherein a lasing wavelength, which is defined by the partial grating, has a shorter wavelength than a material gain peak of the epi stack.

2. The Distributed Feedback Laser of claim 1, wherein the DFB does not include any form of cooling device.

3. The Distributed Feedback Laser of claim 1, wherein the highly reflective medium is a high reflectivity (HR) back facet.

4. The Distributed Feedback Laser of claim 1, wherein the highly reflective medium is a broadband grating mirror.

5. The Distributed Feedback Laser of claim 4, wherein the broadband grating mirror is a chirped grating.

6. The Distributed Feedback Laser claim 1, wherein the epi stack is flip chip mounted onto the Si PIC.

7. The Distributed Feedback Laser of claim 6, wherein the Si PIC includes one or more silicon waveguides, which align with at least one of the active material layers of the epi stack.

8. The Distributed Feedback Laser of claim 1, wherein the active material layers of the epi stack are formed from an Al based InP epitaxy.

9. The Distributed Feedback Laser of claim 8, wherein the epi stack includes active layers formed of $Al_{(x)}GaIn_{(y)}As$.

10. The Distributed Feedback Laser of claim 9, wherein the epi stack includes a PIN junction.

11. The Distributed Feedback Laser of claim 10, wherein the active material layers of the epi stack are undoped and form the intrinsic portion of the PIN junction.

12. The Distributed Feedback Laser of claim 11, wherein the partial grating is located on one side of the active material layers, and wherein the epi stack comprises P-doped layers on the same side of the active material layers as the partial grating.

13. The Distributed Feedback Laser of claim 12, wherein the epi stack comprises N-doped layers on the opposite side of the material layers from the partial grating.

14. An array of DFB lasers, each laser in the array corresponding to a laser according to claim 1.

15. The array of DFB lasers according to claim 14, wherein each laser of the array provides a separate channel having a wavelength which is different from the wavelengths of each of the other channels formed by the other DFB lasers of the array.

16. The Distributed Feedback Laser of claim 1, wherein an active material layer of the one or more active material layers comprises an Al based InP epitaxy.

17. A Distributed Feedback (DFB) Laser for mounting on a Silicon Photonic Integrated Circuit (Si PIC), the DFB laser having a longitudinal length which extends from a first end of the DFB laser to a second end of the DFB laser, the DFB laser comprising:
   an epi stack, the epi stack comprising:
      one or more active material layers; and
      a layer comprising a partial grating, the partial grating extending from the second end of the DFB laser, only partially along the longitudinal length of the DFB laser such that it does not extend to the first end of the DFB laser;
   a highly reflective medium located at the first end of the DFB laser; and
   a back facet located at the second end of the DFB laser, and
   the DFB laser being enabled to operate without an optical isolator,
   wherein a lasing wavelength, which is defined by the partial grating, has a shorter wavelength than a material gain peak of the epi stack.

18. The Distributed Feedback Laser of claim 17, wherein the DFB laser is further enabled to operate without a cooling device.

19. A Distributed Feedback (DFB) Laser for mounting on a Silicon Photonic Integrated Circuit (Si PIC), the DFB laser having a longitudinal length which extends from a first end of the DFB laser to a second end of the DFB laser, the DFB laser comprising:
   an epi stack, the epi stack comprising:
      one or more active material layers; and
      a layer comprising a partial grating, the partial grating extending from the second end of the DFB laser, only partially along the longitudinal length of the DFB laser such that it does not extend to the first end of the DFB laser, and defining a lasing wavelength having a wavelength that is shorter than a material gain peak of the epi stack;
   a highly reflective medium located at the first end of the DFB laser; and
   a back facet located at the second end of the DFB laser.

* * * * *